United States Patent [19]

Gaglani

[11] Patent Number: 5,446,401
[45] Date of Patent: Aug. 29, 1995

[54] SYNCHRONOUS DUAL WORD DECODING USING PLA

[75] Inventor: Pranay Gaglani, Austin, Tex.

[73] Assignee: Advanced Micro Devices, Inc., Sunnyvale, Calif.

[21] Appl. No.: 214,529

[22] Filed: Mar. 13, 1994

[51] Int. Cl.[6] .................. H03M 7/38; H03K 19/084
[52] U.S. Cl. ...................................... 326/108; 326/45
[58] Field of Search .............. 326/39, 45, 105, 106, 326/108

[56] References Cited

U.S. PATENT DOCUMENTS

| | | | |
|---|---|---|---|
| 4,477,739 | 10/1984 | Proebsting et al. | 327/106 |
| 4,641,286 | 2/1987 | Shimotori et al. | 327/106 |
| 4,899,315 | 2/1990 | Houston | 327/106 |
| 5,257,229 | 10/1993 | McClure et al. | 327/106 |
| 5,262,994 | 11/1993 | McClure | 365/200 |

Primary Examiner—Edward P. Westin
Assistant Examiner—Richard Roseen
Attorney, Agent, or Firm—Davis Chin

[57] ABSTRACT

A logic circuit arrangement for performing synchronous dual word decoding utilizing a programmable logic array which is formed with a reduced number of transistor counts. This is achieved by organizing the AND plane (64) so as to decode only the seven (7) most significant bits of an 8-bit opcode word. A LSB decoder circuit (153) is used for decoding the least significant bit of the opcode word separately and outside of the AND plane. As a result, the amount I.C. chip space required has been substantially reduced.

12 Claims, 3 Drawing Sheets

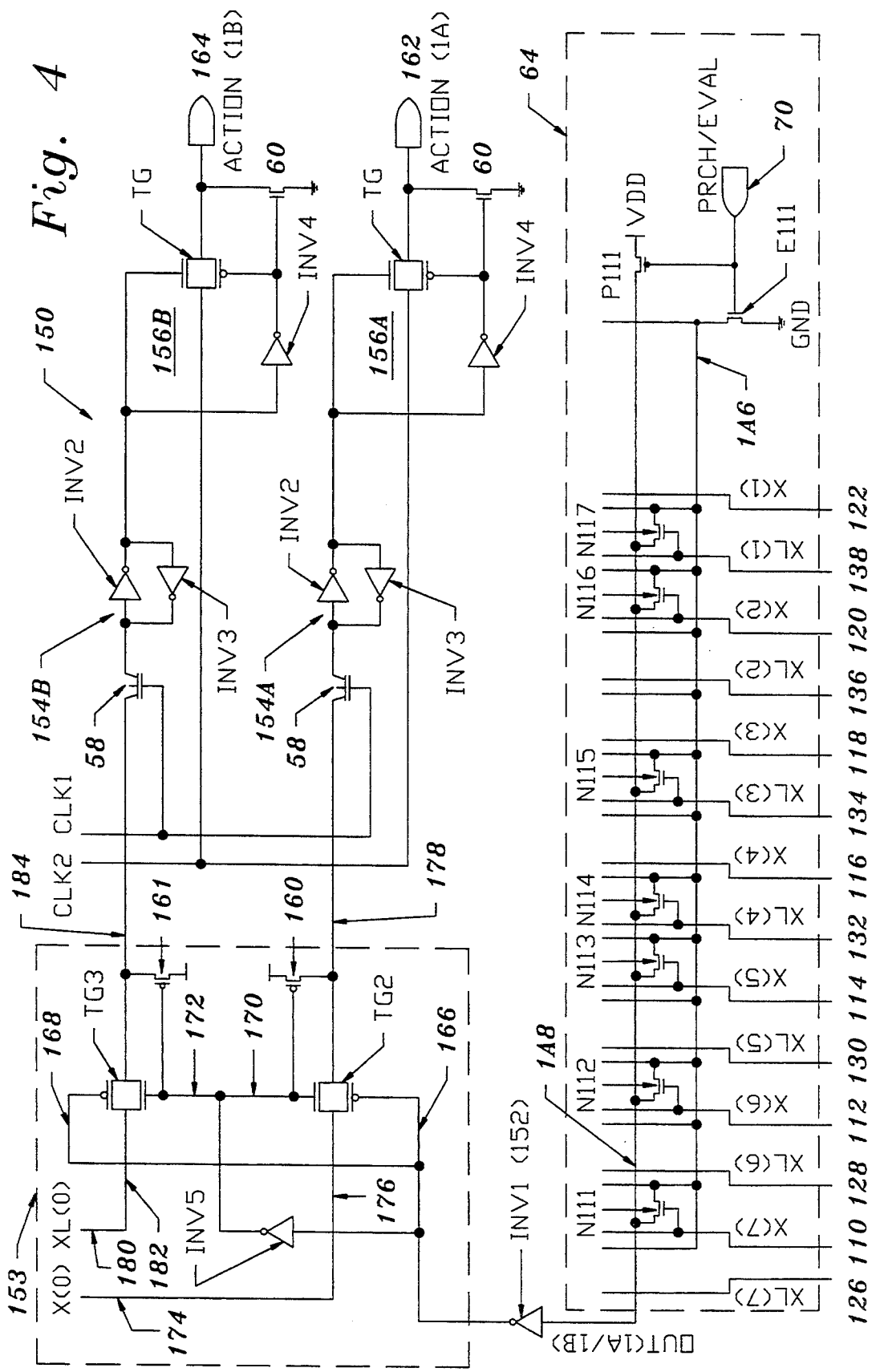

SYNCHRONOUS DUAL WORD DECODING USING PLA

BACKGROUND OF THE INVENTION

This invention relates generally to programmable logic array circuitry and more particularly, it relates to an improved logic circuit arrangement for performing synchronous dual word decoding utilizing a programmable logic array which is formed with a reduced number of transistor counts than has been traditionally available.

In recent years, there has arisen the need of incorporating various functionalities onto a single semiconductor integrated circuit chip, especially when designing large scale integrated (LSI) circuits or very large scale integrated (VLSI) circuits. Thus, different modules or blocks representing unique operations, either partially dependent or totally independent of one another, may now be formed on the same integrated circuit. The activation of these modules are determined by control commands which are received by these modules. Each of the blocks on the integrated circuit are typically assigned a distinct control command. As the number of modules becomes increasingly higher on the same integrated circuit, the corresponding number of required control commands will likewise become higher.

It is generally known that decoding of these control commands or operational codes (opcode words) can be achieved by a programmable logic array (hereinafter called PLA). Hence, with the increased number of control commands the size of the PLA that decodes the opcode words becomes larger and thus require larger amounts of chip space. Accordingly, when the programmable logic arrays are implemented on an integrated circuit it would be desirable to minimize the number of circuit components used in order to reduce manufacturing and assembling costs. Further, the larger the size of the PLA will increase the number of output decode lines which are typically interconnected or routed to other circuits located in different parts of the same integrated circuit. As a result, there is necessitated a relatively large amount of physical space required for fabricating the interconnections thereby increasing the cost of the overall integrated circuit. Thus, it would be expedient to reduce the number of decode lines so as to minimize routing and the amount of required chip area.

In general, a PLA is a logic circuit which receives a plurality of digital input signals and generates a plurality of digital output signals wherein each of the digital output signals is a programmable sum-of-product combination of the input signals. In conventional programmable logic arrays, there is provided a two "plane" structure consisting of two separate regions or groupings of logic gates with the outputs of one region being fed into the inputs of the other region. For example, a basic PLA structure is comprised of an AND plane for generating a plurality of product terms which are the logical AND of selected input signals and an OR plane for generating the output signals by selectively ORing the AND terms. Since the digital input signals to the PLA consist of the opcode words and their complements, which are to be decoded, the primary concern is in relationship to the structure of the AND plane in the PLA.

A block diagram of a prior art arrangement of the AND plane in the PLA is illustrated in FIG. 1 and has been labeled "Prior Art." Here, the AND plane is designated generally by reference numeral 2 which receives on respective input lines 3 and 4 the digital input signal x(7:0) and its complement $\overline{x}(7:0)$. The input signal x(7:0) is an 8-bit word which represents the control command or the opcode word to be decoded. The input signal $\overline{x}(7:0)$ is the complement of the control command, i.e., $\overline{x}(7)$=not x(7), $\overline{x}(6)$=not x(6), and so on. The AND plane also receives a precharge signal on line 5 and an evaluation signal on line 6. While the precharge signal and the evaluation signal are shown as two different signals, it should be noted that they could be the same signal since only one of the two signals (precharge and evaluation) is active at any given time. Thus, with a opcode word having a length of eight bits there are a maximum of 256 outputs available on the output lines 7. Each one of the outputs correspond to a "leg" in the AND plane 2.

In FIG. 2, there is shown a detailed schematic circuit diagram of two legs of the AND plane 2 in the PLA of FIG. 1 for decoding two opcode words and their associated command controlled action generation circuitry. The first leg OUT(1A) is comprised of programming transistors N1–N8, a precharge transistor P1, and an evaluation transistor E1. The 8-bit input signal x(7:0) is received on lines 10–24, and the complement signal $\overline{x}(7:0)$ is received on lines 26–40. The precharge/evaluate signal (PRCH/EVAL) is applied to input line 42 which is connected to the gates of the transistors P1 and E1. The first leg OUT(1A) is used to decode, for example, a first control word $x_1(7:0)$ expressed in binary as 00011010 or in hexadecimal as Hex 1A. The complement $\overline{x}_1(7:0)$ or $x_1L(7:0)$ of the first control word expressed in binary will be 11100101.

In order to decode the first control word $x_1(7:0)$=00011010, the eight programming transistors N1–N8 have their respective drain and source electrodes connected between the first output leg OUT(1A) on output line 44 and a Dynamic Ground line 46. The gate electrodes of the transistors N1–N8 are connected to receive corresponding input literals $x_1(7)$, $x_1(6)$, $x_1(5)$, $x_1L(4)$, $x_1L(3)$, $x_1(2)$, $x_1L(1)$, and $x_1(0)$ on the respective lines 10, 12, 14, 32, 34, 20, 38 and 24. The precharge transistor is comprised of P-channel MOS transistor and has its source connected to an upper power supply voltage or potential VDD, its drain connected to the output line 44, and its gate connected to receive the signal PRCH/EVAL on the input line 42. The evaluation transistor E1 is comprised of an N-channel MOS transistor and has its drain connected to the Dynamic Ground line 46, its source connected to a lower power supply voltage or reference ground potential GND, and its gate connected to receive also the signal PRCH/EVAL.

During the precharge phase (the signal PRCH/EVAL is at a low logic level), the transistor P1 is turned on so as to charge the output line 44 to a high level and the transistor E1 is turned off. During the evaluation phase when the signal PRCH/EVAL is at a high logic level, the transistor P1 is turned off and the transistor E1 is turned on so as to connect the Dynamic Ground line 46 to the reference ground potential GND. As a result, the high level on the output line 44 may then be discharged through certain ones of the programming transistors whose gate electrode is connected to a high or "1" logic level. However, in this case it will be noted that none of the programming transistors N1–N8 in the first leg will be turned on when the first control word is equal to 00011010 since all of the input literals will be at a low or "0" logic level. Consequently, the output OUT(1A) on the line 42 will remain charged to a high level.

Similarly, the second leg OUT(1B) is comprised of programming transistors N11-N18, a precharge transistor P2 and the evaluation transistor E1. It will be noted that while a separate precharge transistor is used for each leg the evaluation transistor E1 is shared. The signal PRCH/EVAL on the line 42 is also connected to the gate of the precharge transistor P2. The second leg OUT(1B) is used to decode, for example, a second control word $x_2(7:0)$ expressed in binary as 00011011 (Hex 1B), which is the next higher binary number than the first control word. The complement $\overline{x}_2(7:0)$ or $x_2L(7:0)$ of the second control word expressed in binary will be 11100100.

In order to decode the second control word 00011011, the eight programming transistors N11-N18 have their respective drain and source electrodes connected between the second leg OUT(1B) on line 48 and the shared Dynamic Ground line 46. The gate electrodes of the transistors N11-N18 are connected to receive corresponding input literals $x_2(7)$, $x_2(6)$, $x_2(5)$, $x_2L(4)$, $x_2L(3)$, $x_2(2)$, $x_2L(1)$, and $x_2L(0)$ on the respective lines 10, 12, 14, 32, 34, 20, 38 and 40. The precharge transistor P2 is comprised of a P-channel MOS transistor and has its source connected to the upper power supply potential VDD, its drain connected to the output line 48, and its gate connected to receive the signal PRCH/EVAL on the input line 42.

During the precharge phase, the transistor P2 is turned on so as to charge the output line 48 to a high level and the transistor E1 is turned off. During the evaluation phase, the transistor P2 is turned off and the transistor E1 is turned on. The high level on the output line 48 will be discharged through certain ones of the programming transistors whose gate electrode is connected to a high or "1" logic level. Again, it can be seen that none of the programming transistors N11-N8 of the second leg will be turned on when the second control word $x_2(7:0)$ is equal to 00011011 since all of the input literals will be at a low or "0" logic level.

For a fully decoded PLA receiving an 8-bit control word, all of the 256 outputs will be charged to a high level during the precharge phase. During the evaluation phase, only one of the 256 outputs will remain charged for a given control word (the output leg having the programming transistors whose gates receive the input literals all equal to the logic "0") and all of the other ones will be discharged.

The associated command controlled action generation circuitry 50 is operatively connected to the output lines 44 and 48 of the PLA for generating a corresponding action in relation to a particular control word at some later point in time. The generation circuit 50 includes a first buffer 52a, a first latch circuit 54a, and a first transmission gate circuit 56a which are associated with the first output leg OUT(1A). The generation circuit 50 also includes a second buffer 52b, a second latch circuit 54b, and a second transmission gate 54b which are associated with the second output leg OUT(1B). Each of the first and second buffers 52a and 52b is formed by an inverter INV1. Each of the first and second latch circuits 54a and 54b is comprised of a pass transistor 58 and inverters INV2 and INV3. Each of the first and second transmission gate circuits 56a and 56b is comprised of a transmission gate TG, an inverter INV4, and a pull-down transistor 60.

While the signal PRCH/EVAL on the line 42 remains at the high level, a first clock signal CLK1 goes high after some delay time so as to send the outputs of the first and second buffers 52a and 52b into the respective first and second latch circuits 54a and 54b. The first clock signal CLK1 will then go low and after some more delay time, the second clock signal CLK2 will go high. Dependent upon the control command decoded and stored in the latch circuit, the second clock signal CLK2 will be passed through the transmission gate circuits so as to generate the corresponding action ACTION(1A) or ACTION(1B) on respective terminals 62 and 64.

The present invention represents an improvement over the prior art illustrated in FIG. 2 of the drawings. In particular, the logic circuit arrangement of the instant invention achieves the same functionality of the AND plane of FIG. 2 with the use of a smaller number of transistor components. This is achieved in the present logic circuit arrangement by organizing the AND plane so as to decode only the first seven (7) bits of the 8-bit opcode. The least significant bit of the opcode word is decoded separately and outside of the AND plane by a LSB decoder circuit.

SUMMARY OF THE INVENTION

Accordingly, it is a general object of the present invention to provide an improved logic circuit arrangement which is relatively simple and economical to manufacture and assemble.

It is an object of the present invention to provide an improved logic circuit arrangement which is formed of a relatively small number of transistor components, thereby reducing the amount of I.C. chip space required and power dissipation.

It is another object of the present invention to provide an improved logic circuit arrangement which has a reduced number of decode lines so as to minimize the amount of physical space required for routing of interconnections between components.

In accordance with these aims and objectives, the present invention is concerned with the provision of an improved logic circuit arrangement having a PLA for performing synchronous dual word decoding. The logic circuit arrangement includes an AND logic plane for receiving a plurality of control command words and their complements and for performing predetermined logic operations thereon and for generating output signals on a plurality of output lines. Each one of the plurality of output lines define a single output leg. The control command words are formed of input logic signals each having a binary code consisting of a plurality of bits except for a least significant bit. Each output leg of the AND logic plane is formed of a plurality of N-channel MOS transistors. Each of the plurality of transistors has its drain connected to one of the plurality of output lines and its source connected to a dynamic ground line. Selected ones of the plurality of transistors have their gates connected to receive corresponding bits of the binary code, and selected other ones of the plurality of transistors have their gates connected to receive a complement of corresponding bits of the binary code.

A least significant bit decoder is coupled to each one of the plurality of output lines and is responsive to the least significant bit and its complement of the binary code for decoding the least significant bit in order to generate a first action signal associated with the least significant bit or a second action signal associated with the complement of the least significant bit.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 4 is a detailed schematic circuit diagram of a single leg of the AND plane in the PLA of FIG. 3 and associated command controlled action generation circuitry.

DESCRIPTION OF THE PREFERRED EMBODIMENT

Figure 1:
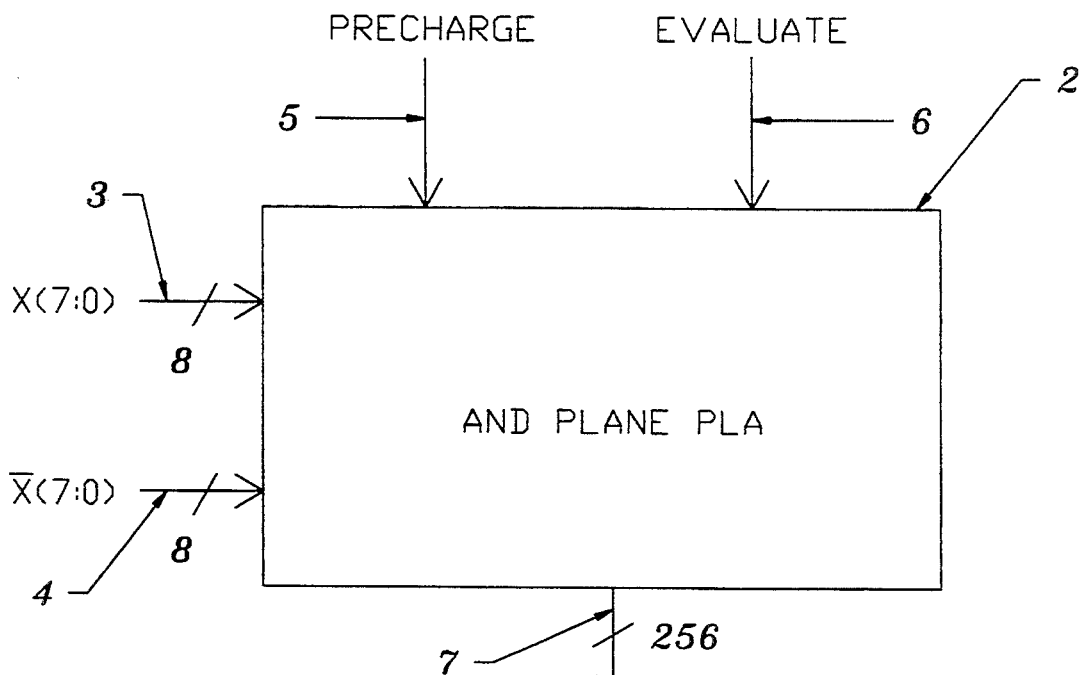
FIG. 1 is a block diagram of a prior art arrangement of the AND plane in a programmable logic array.
Figure 3:
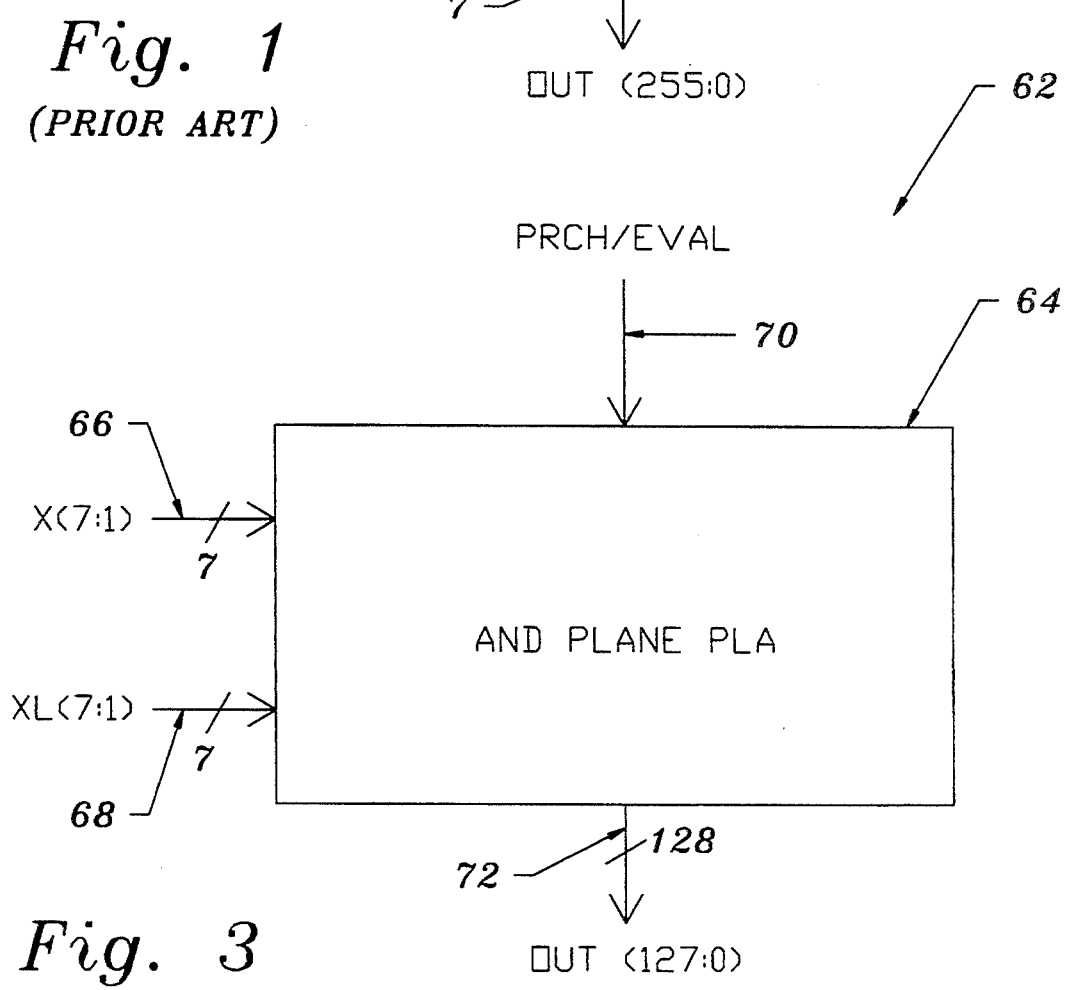
FIG. 3 is a block diagram of a logic circuit arrangement of an AND plane, constructed in accordance with the principles of the present invention.

Referring now in detail to FIG. 3 of the drawings, there is illustrated a block diagram of an improved logic circuit arrangement 62 for performing a synchronous dual word decoding utilizing a programmable logic array (PLA), constructed in accordance with the principles of the present invention. The circuit arrangement of the present invention includes an AND plane 64 which receives on respective input lines 66 and 68 digital input signals x(7:1) and its complement $\bar{x}$(7:1). The input signal x(7:1) is the seven (7) most significant bits (MSBs) of an 8-bit word which represents the control command or opcode word to be decoded. The input signal $\bar{x}$(7:1) is the seven MSBs of the complement of the opcode word. The AND plane 64 also receives a precharge/evaluation signal PRCH/EVAL on line 70.

The inventor has discovered that the AND plane of the PLA can be organized so as to decode only the seven most significant bits of the 8-bit opcode word in order to reduce significantly the number of transistor elements which have been traditionally unavailable. The least significant bit (LSB) of the control word is decoded separately and outside of the AND plane so as to generate the appropriate action, as will be more fully described hereinafter. Since the decoding in the AND plane 64 has been reduced from the 8-bit words in the prior art of FIG. 1 to 7-bit words of FIG. 3, the number of outputs have been reduced correspondingly from 256 to 128 outputs on line 72 for a fully decoded PLA. Accordingly, the routing of the connection wires to other circuitry has been enhanced significantly due to the reduction in half of the output decode lines need. Each one of these output lines corresponds to a "leg" in the AND plane 62.

In FIG. 4, there is shown a detailed schematic circuit diagram of a single leg of the AND plane 64 in the PLA of FIG. 3 for performing dual word decoding and associated command controlled action generation circuitry. The single output leg OUT 1A/1B is comprised of programming transistors N111–N117, a precharge transistor P111, and an evaluation transistor E111. The 7-bit input signal x(7:1) is received on lines 110–122, and the complement signal $\bar{x}$(7:1) is received on lines 128–138. The signal PRCH/EVAL is applied to the line 70 which is connected to the gates of the transistors P111 and E111. The single output leg is used to decode both the first and second control words Hex 1A and Hex 1B, which are the same two words decoded by the first and second legs of the AND plane 2 of FIG. 2.

In order to perform the dual word decoding of these control words Hex 1A and Hex 1B, seven programming transistors N111–N117 have their respective drain and source electrodes connected between the single leg OUT 1A/1B on line 148 and a Dynamic Ground line 146. The gate electrodes of the transistors N111–N117 are connected to receive corresponding seven input literals $x_1(7)$, $x_1(6)$, $x_1(5)$, $x_1L(4)$, $x_1L(3)$, $x_1(2)$, and $x_1L(1)$ on the respective lines 110, 112, 114, 132, 134, 120, and 138. The precharge transistor P111 is comprised of a P-channel MOS transistor and has its source connected to an upper power supply voltage or potential VDD, its drain connected to the output line 148, and its gate connected to receive the signal PRCH/EVAL on the input line 70. The evaluation transistor E111 is comprised of an N-channel MOS transistor which has its drain connected to the Dynamic Ground line 146, its source connected to a lower power supply voltage or reference ground potential GND, and its gate connected also to receive the signal PRCH/EVAL.

In operation, during the precharge phase when the signal PRCH/EVAL is at the low logic level the transistor P111 is turned on so as to precharge the output line 148 to a high level, and the transistor E111 is turned off. During the evaluation phase when the signal PRCH/EVAL is at a high logic level, the transistor P111 is turned off and the transistor E111 is turned on so as to connect the Dynamic Ground line 146 to the reference ground potential GND. As a result, the high level on the output line 148 may now be discharged through certain ones of the programming transistors whose gate electrode is connected to a high or "1" logic level. However, it will be noted that none of the transistors N111–N117 in the output leg OUT1A/1B will be turned on when the control command is either Hex 1A or Hex 1B since all of the input literals will be at a low or "0" logic level. Consequently, the output OUT-1A/1B on the output line 148 will remain charged.

Therefore, for a fully decoded PLA receiving the first seven most significant bits of the 8-bit control word, all of the 128 outputs will be charged to a high level during the precharge phase. During the evaluation phase, only one of the 128 outputs will remain charged. For example, the output leg OUT1A/1B associated with decoding of the control words Hex 1A and Hex 1B will remain charged and all of the other outputs will be discharged.

The logic circuit arrangement 62 further includes an associated command controlled generation circuitry 150 which is operatively connected to the output line 148 of the AND plane 64 of the PLA for generating a corresponding ACTION(1A) or ACTION(1B) in relation to a particular control word at some later point in time. The generation circuitry 150 includes a buffer 152, a LSB decoder circuit 153, first and second latch circuits 154a and 154b, and first and second transmission gate circuits 156a and 156b. It will be noted that the buffer 152 is comprised of an inverter INV1 and that the latch circuits 154a and 154b and the transmission gate circuits 156a and 156b are identical to those used in the generation circuit of FIG. 2.

The LSB decoder circuit 153 is comprised of an inverter INV5, transmission gates TG2 and TG3, and pull-up transistors 160, 161. As can be seen, the output line 148 is connected to the input of the inverter INV1, and the output of the inverter INV1 is connected to the control nodes 166, 168 of the transmission gates TG2 and TG3 and to the input of the inverter INV5. The output of the inverter INV5 is connected to control nodes 170, 172 of the transmission gates TG2 and TG3. The input literal x(0) representing the least significant bit is connected to input line 174 which is fed to the signal input line 176 of the transmission gate TG2. The signal output line 178 of the transmission gate TG2 is fed to the first latch circuit 154a. Similarly, the input literal xL(0) representing the complement of the least significant bit is connected to input line 180, which is fed to the signal input line 182 of the transmission gate TG3. The signal output line 184 of the transmission gate TG3 is fed to the second latch circuit 154b.

In the case of the control word being either Hex 1A or Hex 1B, the high level on the output line 148 will be inverted by the inverter INV1 which serves to turn on the transmission gates TG2 and TG3 of the LSB decoder circuit 153. When the control word is Hex 1A, the least significant bit $x_1(0) = 1$ will be passed through the transmission gate TG2. Alternatively, when the control word is Hex 1B, the complement of the least significant bit $x_2L(0) = 1$ will be passed through the transmission gate TG3. While the signal PRCH/EVAL is still at the high level, the first clock CLK1 goes high after some delay time so as to send either the least significant bit or the complement of the least significant bit into corresponding latch circuit 154a and 154b. The first clock signal CLK1 will then go low and after some delay time, a second clock signal CLK2 will go high. Dependent upon the control command decoded and stored in the latches, the second clock signal CLK2 will be passed through the transmission gate that is turned on so as to generate a corresponding action ACTION(1A) or ACTION(1B) on respective terminals 162 and 164.

Figure 2:
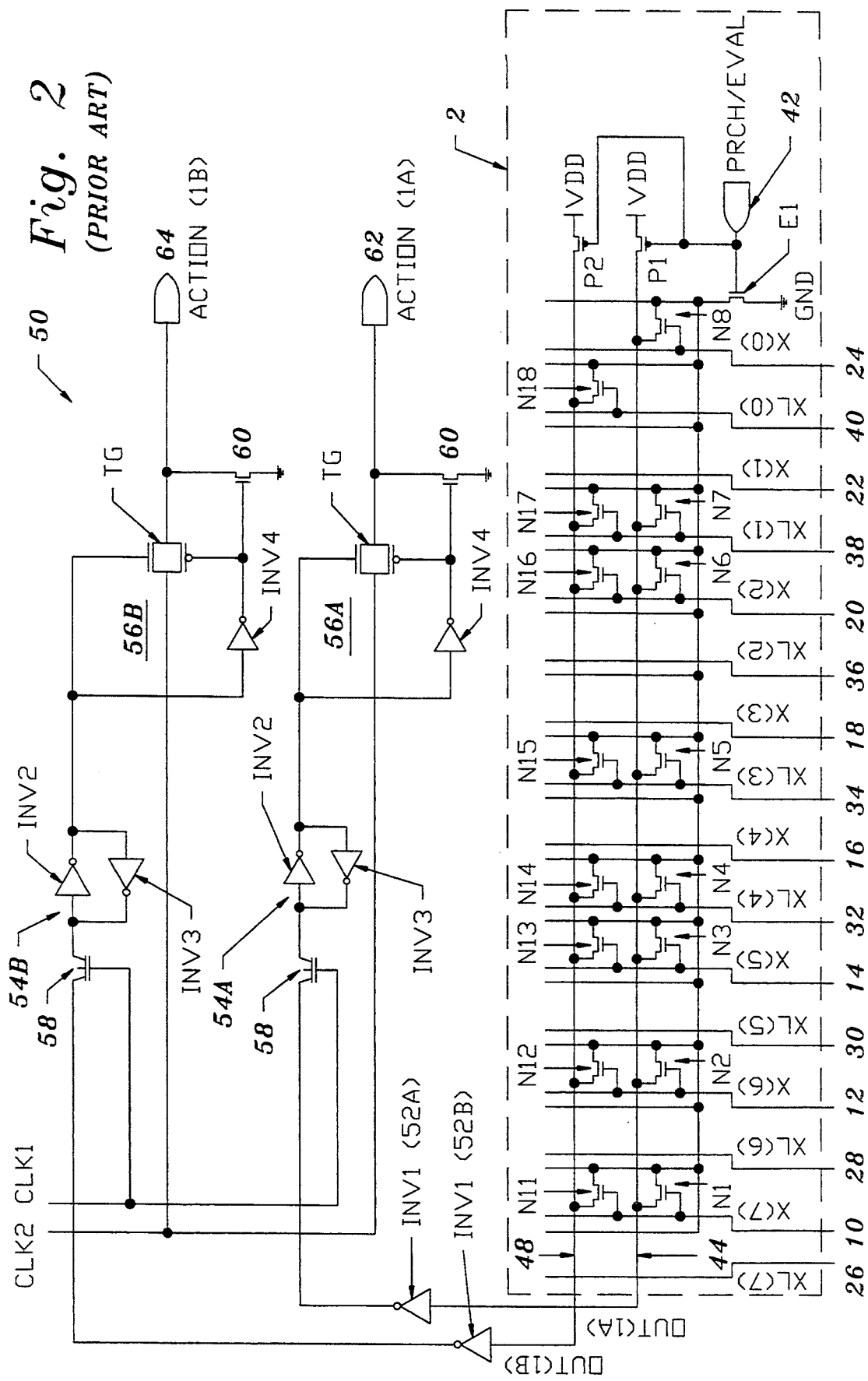
FIG. 2 is a schematic circuit diagram of two legs of the AND plane in the PLA of FIG. 1 and associated command controlled action generation circuitry.

By comparing the number of transistors required in order to generate the two act ions ACTION (1A) and ACTION(1B) in FIG. 4 with the prior art of FIG. 2, it can be seen that the transistor count is reduced by 13 for the two actions. It should be noted that this amount of savings in transistors was based upon the control word being of an 8-bit word. For a control word consisting of a 16-bit word, there is realized an even greater savings. It can be seen for the 16-bit word that the transistor count would be reduced by 29 for the two actions by using a similar analysis.

From the foregoing detailed description, it can thus be seen that the present invention provides an improved logic circuit arrangement for performing synchronous dual word decoding utilizing a programmable logic array which is formed with a reduced number of transistor counts. This is achieved by organizing an AND plane so as to decode only the seven most significant bits of the 8-bit opcode word. Further, a LSB decoder circuit is used to decode separately the least significant bit of the control word.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A logic circuit arrangement including a programmable logic array for performing synchronous dual word decoding, comprising:

AND logic plane means (64) for receiving a plurality of control command words and their complements and performing predetermined logic operations thereon and for generating output signals on a plurality of output lines each defining a single output leg;

said control command words being formed of input logic signals and having a binary code consisting of a plurality of bits except for a least significant bit; and each output leg of said AND logic plane means being formed of one of a plurality of N-channel MOS transistors (N111–N117), each of said plurality of transistors having its drain connected to one of the plurality of output lines and its source connected to a dynamic ground line, selected ones of said plurality of transistors having its gate connected to corresponding bits of the binary code, selected other ones of said plurality of transistors having its gate connected to receive the complement of corresponding bits of the binary code;

means (153) coupled to each one of said plurality of output lines and being responsive to said least significant bit and its complement of said binary code for decoding each one of said plurality of output lines and said least significant bit so as to generate either a first action signal associated with said least significant bit or a second action signal associated with the complement of the least significant bit; and means for precharging each of said plurality of output lines to a high level during a precharge phase of precharge/evaluation signal.

2. A logic circuit arrangement as claimed in claim 1, wherein said precharging means is comprised of a P-channel MOS transistor (P111) having its source connected to an upper power supply potential, its drain connected a corresponding one of said plurality of output lines, and its gate connected to receive said precharge/evaluation signal.

3. A logic circuit arrangement as claimed in claim 2, further comprising means for coupling said dynamic ground line to a lower power supply potential so as to discharge selected ones of said plurality of output lines during evaluation phase of said precharge/evaluation signal.

4. A logic circuit arrangement as claimed in claim 3, wherein said coupling means is comprised of an N-channel MOS transistor (E111) having its drain connected to the dynamic ground line, its source connected to the lower power supply potential, and its gate connected to receive said precharge/evaluation signal.

5. A logic circuit arrangement as claimed in claim 1, wherein said means for decoding each one of said plurality of output lines and said least significant bit includes a buffer (152), first transmission gate means (TG2) having an output, and second transmission gate means (TG3) having an output, said buffer being formed of an inverter (IN1) having its input coupled to said each one of said plurality of output lines and an output, said first transmission gate means having its control means coupled to the output of said inverter and being responsive to said least significant bit for generating said first action signal, said second transmission gate means having its control means coupled to the output of said inverter and being responsive to the complement of said least significant bit for generating said second action signal.

6. A logic circuit arrangement as claimed in claim 5, wherein each of said first and second transmission gate means is comprised of a P-channel transistor and an N-channel transistor, one of the conduction path electrodes of said P-channel transistor being connected to one of the conduction path electrodes of said N-channel transistor, the other one of the conduction path electrodes of said P-channel transistor being connected to the other one of the conduction path electrodes of said N-channel transistor.

7. A logic circuit arrangement as claimed in claim 6, further comprising first latch means (154a) coupled to the output of said first transmission gate and being responsive to a first clock signal for storing said first action signal and third transmission gate means (TG) responsive to an output of said first latch means for transmitting a second clock signal.

8. A logic circuit arrangement as claimed in claim 7, further comprising second latch means (154b) coupled to the output of said second transmission gate and being responsive to the first clock signal for storing said second action signal and fourth transmission gate means (TG) responsive to an output of said second latch means for transmitting the second clock signal.

9. A logic circuit arrangement including a programmable logic array for performing synchronous dual word decoding, comprising:
a plurality of control command signals and their complements, said plurality of control command signals being in the form of first binary codes consisting of a plurality of bits except for a least significant bit and second binary codes consisting of said least significant bit and its complement;
AND logic plane means (64) for receiving said first binary code and performing predetermined logic operations thereon and for generating output signals on a plurality of output lines each defining a single output leg;
each output leg of said AND logic plane means being formed of one of a plurality of N-channel MOS transistors whose gates are responsive to said first binary codes for generating said output signals;
LSB decoding means (153) responsive to said output signals on said plurality of output lines and said second binary code for generating either a first action signal or a second action signal and
means for precharging each of said plurality of output lines to a high level during a precharge phase of a precharge/evaluation signal.

10. A logic circuit arrangement as claimed in claim 9, wherein said precharging means is comprised of a P-channel MOS transistor (P111) having its source connected to an upper power supply potential, its drain connected a corresponding one of said plurality of output lines, and its gate connected to receive said precharge/evaluation signal.

11. A logic circuit arrangement as claimed in claim 10, further comprising means for coupling a dynamic ground line to a lower power supply potential so as to discharge selected ones of said plurality of output lines during evaluation phase of said precharge/evaluation signal.

12. A logic circuit arrangement as claimed in claim 11, wherein said coupling means is comprised of an N-channel MOS transistor (E111) having its drain connected to the dynamic ground line, its source connected to the lower power supply potential, and its gate connected to receive said precharge/evaluation signal.

* * * * *

UNITED STATES PATENT AND TRADEMARK OFFICE
CERTIFICATE OF CORRECTION

PATENT NO. : 5,446,401
DATED : August 29, 1995
INVENTOR(S) : Pranay Gagliani

It is certified that error appears in the above-indentified patent and that said Letters Patent is hereby corrected as shown below:

Column 7, line 45, change "act ions" to --actions--.

Signed and Sealed this

Twenty-eighth Day of November 1995

Attest:

BRUCE LEHMAN

*Attesting Officer*    *Commissioner of Patents and Trademarks*